(12) United States Patent
Marti et al.

(10) Patent No.: US 8,219,335 B2
(45) Date of Patent: Jul. 10, 2012

(54) ELECTRIC WINDING DISPLACEMENT DETECTION METHOD AND APPARATUS

(76) Inventors: Jose R. Marti, Vancouver (CA); Krishan D. Srivastava, Aldergrove (CA); Qiaoshu Jiang, Calgary (CA)

(*) Notice: Subject to any disclaimer, the term of this patent is extended or adjusted under 35 U.S.C. 154(b) by 928 days.

(21) Appl. No.: 10/599,207

(22) PCT Filed: Mar. 23, 2005

(86) PCT No.: PCT/CA2005/000438
§ 371 (c)(1),
(2), (4) Date: Aug. 26, 2008

(87) PCT Pub. No.: WO2005/091004
PCT Pub. Date: Sep. 29, 2005

(65) Prior Publication Data
US 2008/0300807 A1      Dec. 4, 2008

Related U.S. Application Data

(60) Provisional application No. 60/555,316, filed on Mar. 23, 2004.

(51) Int. Cl.
*G06F 17/10* (2006.01)
(52) U.S. Cl. ............... 702/65; 702/124; 324/547
(58) Field of Classification Search ............... 702/57–60, 702/64, 65, 109, 112, 123, 124; 324/546, 324/547, 600, 602, 603
See application file for complete search history.

(56) References Cited

U.S. PATENT DOCUMENTS

| | | | |
|---|---|---|---|
| 4,857,856 A | 8/1989 | Coleman et al. | |
| 6,035,265 A * | 3/2000 | Dister et al. | 702/183 |
| 6,466,034 B1 | 10/2002 | Wang et al. | |
| 6,549,017 B2 | 4/2003 | Coffeen | |
| 6,680,616 B2 | 1/2004 | Khalin et al. | |
| 6,853,939 B2 * | 2/2005 | Coffeen | 702/108 |

OTHER PUBLICATIONS

PCT Patent Application No. PCT/CA2005/000438, International Search Report dated Jul. 14, 2005.

* cited by examiner

*Primary Examiner* — Manuel L Barbee
(74) *Attorney, Agent, or Firm* — Shin Hung; Borden Ladner Cervais LLP

(57) ABSTRACT

A method and system for obtaining the characteristic impedance of an electrical winding by measuring the input and output voltages and the currents within a winding across a low frequency range, and applying transmission line properties to model the winding. The characteristic impedance (Zc) is directly proportional to the capacitance of the winding, and is independent of external circuits. Thus any changes to Zc will reflect movements of the winding that would affect the capacitance. Because Zc has a smooth and robust monotonical relationship with frequency of the applied signal, the resulting curve is exponential in shape. A relative comparison between Zc curves will provide a clear indication of the overall axial or radial winding movements, or winding faults, which can be used to assess the overall health of the winding.

35 Claims, 12 Drawing Sheets

1 for sensing end
2 for receiving end
coil 1: a1, a2
coil 2: b1, b2
coil 3: c1, c2

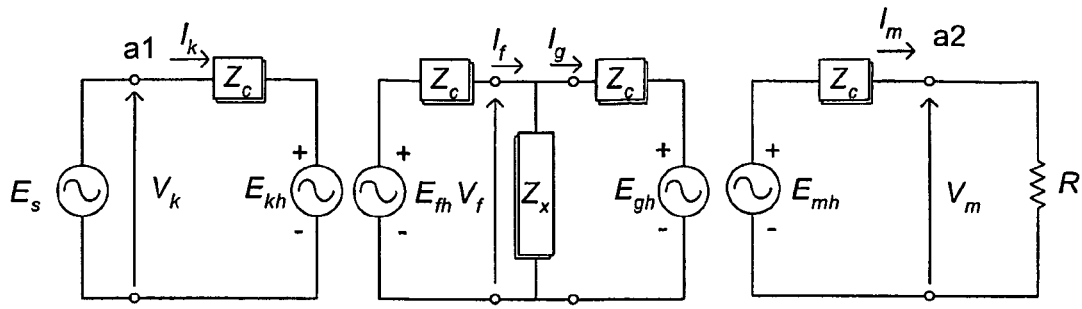

Figure 8

```
% Matlab script for solving the nonlinear equations
% Define the nonlinear equations
```
$$F1 = V_k - Z_c I_k - (V_f - Z_c I_f)e^{-\gamma_1}$$

$$F2 = (V_k + Z_c I_k)e^{-\gamma_1} - V_f + Z_c I_f$$

$$F3 = (I_m R - I_m Z_c)e^{-(\gamma+\gamma_1)} - \frac{V_f Z_c}{Z_x} - V_f - Z_c I_f$$

$$F4 = (V_f + Z_c I_f - \frac{Z_c V_f}{Z_x})e^{-(\gamma+\gamma_1)} - I_m R + Z_c I_m$$

```
F = '[F1; F2;F3;F4]';
% Set initial values
x0 = [0; 0;0;0];
options = optimset('Display','iter');
% Solve
[x,fval] = fsolve(F,x0,options)
```

Figure 9

ELECTRIC WINDING DISPLACEMENT DETECTION METHOD AND APPARATUS

FIELD OF THE INVENTION

The present invention relates generally to conductive windings used in electrical components. More particularly, the present invention relates to conductive windings found in transformers and electrical motors and generators.

BACKGROUND OF THE INVENTION

In an AC power system, power transformers are used to convert electric power from one potential level to another.

Transformers are one of the most essential elements of an electric power system. They are widely used in electric networks because the generation, transmission, and distribution of power require different voltage levels. For example, in a large power utility, the number of transformers can exceed 1000. They link electric loads to power supplies through an interconnected power network and satisfy the requirements of both parts. The use of transformers helps to reduce losses in an AC power system.

Transformers are one of the most expensive pieces of equipment in a power grid. A large power transformer in a 500 kV system may cost in the order of a million dollars. In 1996, the total sale of power transformers in the United States was over US$ 11 million. In terms of numbers, more than 8000 transformers, of at least 2 MVA and up to more than 100 MVA, were sold in the same year all over the world.

Since transformers play a vital role in the operation of AC or HVDC electric networks, it is important to ensure that they are operating efficiently and reliably. Furthermore, the failure of a transformer can be potentially devastating to personnel safety and to the environment. Transformers may fail explosively causing great personal injuries to people around them and damage to the surrounding equipment. The environment can be adversely affected by the leakage of oil. A failure also has a large economic impact due to its high cost of replacement and repair and lost revenue while it is out of service. During its outage, the customers of a utility can be greatly inconvenienced, which could result in a loss of goodwill towards the utility.

Transformers are well known in the art, and can include dry type transformers and fluid-filled transformers, with different core configurations. FIG. 1 illustrates an iron-core transformer which is typically encased within a tank. Generally, the iron-core transformer consists of one or more sets of windings that are coupled through a common magnetic core. The main components of transformer 10 shown in FIG. 1 include a laminated iron core 12, and a set of windings 14a and 14b, where winding 14a can be a high voltage winding while winding 14b can be a low voltage winding. Each set of windings normally consist of two or three windings: a primary winding, a secondary winding, and sometimes a tertiary winding, mounted concentrically on top of each other. As shown in FIG. 1, windings 14a and 14b are wrapped around the legs of the rectangular window iron core 12. The windings 14 are usually made of copper or aluminum, and can be shaped as either wires or sheets with an insulating layer 16 separating successive layers of the windings. The windings 14 are clamped to the tank structure to maintain their physical positioning. Core clamps 18 are used to fix the core to the tank structure. Ceramic bushings are used to isolate the windings from grounded structures of the transformer such as the oil tank. Mineral oil is typically used as insulation medium, and for cooling the transformer. In operation, a time-varying flux created by one winding induces a voltage in the other winding. FIG. 1 represents one known configuration of a core-type transformer, and those of skill in the art will understand that there are a number of known configurations.

Inevitably in service transformer failures occur due to either internal failures and/or external failures. As the context of the present invention is related to internal failures, external failures will not be discussed.

Internal failures are faults that occur inside the tank, such as short circuits between windings, short circuits between windings and iron, short circuits between turns, insulation deterioration, loss of winding clamping, partial discharges and winding resonance. One of the primary causes of internal failures is winding movement, or displacement, which can lead to insulation deterioration, and winding collapse. When the insulation deteriorates, windings can electrically contact each other, resulting in high current flow, partial discharges, and very severe and expensive faults.

An external short circuit fault, for example, created by lightning strike or ground fault, is the most likely factor to cause winding movement. Assuming a copper winding is wound on a ferromagnetic core and the transformer is in service, the currents carried by the windings will produce the predominant flux in the axial direction. The interaction of the current in the coils in the circumferential direction and the axial flux field will therefore produce a radial outward electromagnetic force. FIG. 2 illustrates possible movement of a winding 20 relative to a core 22 of a typical iron-core transformer. A current 1 flowing through the winding 20 in the direction as indicated by the arrows, can suffer from movement in the axial direction as shown by arrows 24, and outward winding movement in the radial direction as shown by arrows 26. There is, however, a leakage flux around individual turns and near the ends of the windings which has a component in the radial direction. This radial flux induces an axial inward electromagnetic force. Under normal operation of power transformer, the windings are designed to withstand the mechanical pressure described above. However, when short circuits happen, the electromagnetic forces induced in the windings are increased dramatically and threaten the insulation layers severely. For example, if a transformer's leakage impedance is 10%, its short circuit current will be 10 times the rated current and the mechanical stress will be roughly 100 times of the normal stress under the rated load current.

In the event of a short circuit situation, the winding will stretch out in the radial direction and compress in the axial direction. The radial forces in a 10 MVA transformer can exceed 100,000 lbs. Such huge electromagnetic forces will inevitably loosen the winding clamp structure, which is the main mechanical support of the winding and cause the distortion or movement of the winding.

Inrush currents, due to the powering up of the transformer circuit, and vibration forces increase the electro-magnetic forces in the same way as short circuits. The frequent fluctuation in generation or load will also put burdens to the electrical and mechanical strength of the windings, accelerate the loosening of the winding clamps, and eventually cause the winding to move or even break down. Furthermore, winding bulges or sharp edges of the coil can cut through insulation and cause short circuits between turns, which can be exacerbated as the winding moves.

Since a large number of failures are due to the windings, techniques for diagnosing the health of a transformer have been proposed, since it is useful to be able to assess the health of a winding to enable prediction of remaining life, capacity limits, and preventive maintenance. A short summary of some of these methods follows.

There are several known methods to assess the health of a winding, including detection of insulation degradation. By way of example, insulation degradation in transformers can be monitored by methods that detect partial discharges. Partial discharge detection methods include Dissolved Gas Analysis and Tan-Delta techniques. It is notable that Dissolved Gas Analysis methods detect the chemical reaction products of insulation degradation, and therefore partial discharge must have occurred before these techniques are useful. The Tan-Delta similarly detects damage that has already occurred.

The winding ratio test measures the numbers of turns of both primary and secondary windings and calculates the ratio between them. By comparing the measured winding ratio with the ratio of rated primary and secondary voltages as shown on the nameplate of the transformer, shorted turns or open winding faults may be detected. However, an outage and isolation of the transformer is required for the purpose of measurements.

The winding resistance test, which is similar to the winding ratio test, except that it measures the winding resistance rather than the number of winding turns. Additionally, a very precise ohmmeter is needed, which will assure the accuracy of a fraction of an ohm. The measured resistance will be compared with the previous measurement referred to the same temperature. Measurements are conducted for different phases and different tap-changer positions. This method detects the condition of the winding conductor directly. However, it requires a transformer outage and is usually performed in the factory or a laboratory.

The 60 Hz transformer impedance test measures the input voltage, input current and input power while shorting the low voltage winding of the transformer. The before and after results are then compared with the before and after short circuit. This test is insensitive to small winding movements.

The leakage reactance measurement (LRM), which can be achieved with the same test set-up as the short circuit impedance measurement, is based on the increased leakage reactance resulting from the radial outward force on the outer winding and the radial inward force on the inner winding induced by short circuits.

Another way to assess the health of a winding is to detect winding displacement. Detection of winding displacement is advantageous because such methods permit detection of deterioration prior to actual winding damage. Known winding displacement detection methods include detection of increases of the audible noise, visual inspection, short-circuit impedance measurement, vibration analysis, low voltage impulse, and swept Frequency Response Analysis ('FRA') techniques.

The FRA technique compares the input admittance function $Y(\omega)$ of the displaced winding with the $Y(\omega)$ of an equivalent healthy winding. This technique is well known in the art, and looks at the transformer as a lumped impedance and measures the admittance function $Y(\omega)$ as the ratio of input current to applied voltage for a range of high frequencies (e.g., 1 to 10 MHz). The idea of the FRA test is to compare the "signature" of the transformer, as defined by the shape of the $Y(\omega)$ function, as it changes with aging.

FIG. 3 shows measurement plots made using the FRA technique of a healthy winding 20 versus that of a displaced winding 22. The admittance $Y(\omega)$ in siemens is plotted on the vertical axis while frequency in MHz is plotted on the horizontal axis. Two main problems exist with this technique. First, the frequency response differences between the two curves only begin to appear at frequencies beyond 2-4 MHz. Unfortunately, online measurements are corrupted due to electrical noise interference, which becomes problematic at these frequencies. Second, the observed response distortion is difficult to directly correlate any specific problem with the displaced winding, and in particular, to the amount of winding displacement.

The main problem with the FRA technique is that the $Y(\omega)$ function is highly oscillatory because it includes all the winding electrical parameters: resistance, inductance, and capacitance and, in addition, is very sensitive to electrical noise and to numerical noise in the processing of the signals. As a result, FRA tests are normally performed off-line with the equipment removed from service and in a very controlled test environment. Taking a power transformer out of service is very expensive and sometimes not even feasible because of service continuity constraints.

It is, therefore, desirable to provide a method and system for assessing the health of electrical windings in transformers without having to remove the transformer unit from service, while providing effective determination of winding displacement and/or faults in the winding.

SUMMARY OF THE INVENTION

It is an object of the present invention to obviate or mitigate at least one disadvantage of previous electrical winding health assessment techniques. In particular, it is an object of the present invention to provide a method and apparatus for effectively assessing the health of an electrical winding with high sensitivity and without having to disconnect or remove the unit containing the winding from its environment.

In a first aspect, the present invention provides a diagnostic device for generating a characteristic impedance for an electrical winding having an input terminal and an output terminal. The diagnostic device including a signal generator, sensing means, processing means and storage means. The signal generator applies an electrical signal having a frequency component to the input terminal of the electrical winding. The sensing means detects a magnitude and a phase of an output electrical signal at the output terminal of the electrical winding. The sensing means then converts the magnitude and the phase of the output electrical signal into digital signals. The processing means sets parameters of the electrical signal and receives the digital signals. The processing means then calculates the characteristic impedance with the digital signals and the parameters of the electrical signals corresponding to one frequency, based on a transmission line model of the electrical winding. The storage means stores the digital signals and the parameters of the electrical signal.

In embodiments of the present aspect, the signal generator can include one of a function generator and a network analyzer for generating the electrical signal at the one frequency, the one frequency can be a minimum frequency selected corresponding to a maximum length of the electrical winding, or the one frequency is at least about 500 kHz. The sensing means can include a high speed digital data recorder, and the storage means can include a memory device.

According to another embodiment of the present aspect, the processing means includes a sequence generator and a calculation engine. The sequence generator sets the parameters of the electrical signal for generation by the signal generator, where the parameters can including input voltage, input current and the one frequency. The calculation engine receives the input voltage, the input current, the one frequency, and the digital signals, and is programmed with the transmission line model of the electrical winding for calculating the characteristic impedance. The processing means can further include a controller core, a fuzzy logic engine and a graphic engine. The controller core can receive the characteristic impedance from the calculation engine, for comparing the characteristic impedance with a base characteristic impedance to provide a corresponding difference value. The fuzzy logic engine can receive the corresponding difference value and apply pre-programmed fuzzy logic to provide a corresponding text message. The graphic engine can receive the characteristic impedance and the base characteristic impedance for generating graphical plot information.

In further aspects of the present embodiment, the controller calculates an approximate displacement value of the electrical winding corresponding to the difference value, and the user interface displays the corresponding text message and displays the graphical plot information as a graph of impedance versus frequency.

In yet another embodiment of the present aspect, the transmission line model of the electrical winding is expressed by $$V_k e^{-\gamma l} + Z_c I_k e^{-\gamma l} = Z_c I_m + R I_m;$$

$$V_k - Z_c I_k = R I_m e^{-\gamma l} - Z_c I_m e^{-\gamma l};$$

for representing the circuit model of the electrical winding shown in FIG. 6. The transmission line model of the electrical winding can be further expressed by $$V_k - Z_c I_k = (V_f - Z_c I_f) e^{-\gamma l};$$

$$(V_k + Z_c I_k) e^{-\gamma l} = V_f + Z_c I_f;$$

$$(I_m R - I_m Z_c) e^{-(\gamma + \gamma_1)} - \frac{V_f Z_c}{Z_x} = V_f - Z_c I_f;$$

$$\left(V_f + Z_c I_f - \frac{Z_c V_f}{Z_x}\right) e^{-(\gamma + \gamma_1)} = I_m R + Z_c I_m;$$

where each expression represents a loop in the circuit model of the electrical winding shown in FIG. 8.

In further embodiments of the present aspect, the signal generator can include a recurrent surge generator for generating the electrical signal, where the electrical signal includes a train of pulses, such as a train of square pulses. The processing means can include a calculation engine for executing a Fourier transform algorithm to decompose the electrical signal and the digital signals into frequency components. The electrical winding can include a transformer winding housed in a tank, and the transformer can be on-line.

In a second aspect, the present invention provides a method for determining a characteristic impedance of an electrical winding. The method includes the steps of applying an input signal having a frequency component to a first terminal of the electrical winding; measuring an output signal at a second terminal of the electrical winding; storing the input signal data and the output signal data; and calculating the characteristic impedance based on a transmission line model of the electrical winding with the input signal data and the output signal data corresponding to one frequency.

According to embodiments of the present aspect, the step of applying can include generating an analog signal having predetermined voltage and current values at the one frequency, the one frequency can be a minimum frequency selected corresponding to a maximum length of the electrical winding, or the one frequency can be at least about 500 kHz.

In another embodiment of the present aspect, the step of applying includes generating a pulse train having predetermined voltage and current values, and the step of calculating includes executing a Fourier transform algorithm for decomposing the input signal and the output signal into frequency components, where the frequency components include the one frequency. The one frequency can be at least about 500 kHz.

In yet another embodiment of the present aspect, the steps of applying, measuring and storing are repeated for a plurality of distinct frequencies before the step of calculating. The step of calculating can include calculating the characteristic impedance of the electrical winding at each of the plurality of distinct frequencies. The electrical winding can include a transformer winding housed in a tank, and the transformer can be on-line.

In a third aspect, the present invention provides a method for assessing a condition of an electrical winding. The method includes a) obtaining a base characteristic impedance of the electrical winding at a first time; b) storing the base characteristic impedance corresponding to the first time; c) obtaining a current characteristic impedance of the electrical winding at a second time after the first time; d) storing the current characteristic impedance corresponding to the second time; e) calculating a difference value between the current characteristic impedance and the base characteristic impedance; and f) calculating an approximate winding displacement from the difference value.

According to embodiments of the present aspect, the method further includes a step of calculating an approximate fault impedance of the electrical winding at the second time, and the step of obtaining the base characteristic impedance includes calculating the base characteristic impedance from the expression $$Zc = 120\pi \sqrt{\frac{\mu}{\varepsilon}} \frac{N}{h} \frac{b}{1 + b/d} \; \Omega$$

where:
Zc is the base characteristic impedance,
μ is a magnetic permeability of the electrical winding material
∈ is a dielectric constant of insulation material
N is a total number of the turns of the electrical winding
h is an axial length of the electrical winding
b is an insulating distance between the electrical winding and a core of a transformer
d is an insulating distance between the electrical winding and a tank of the transformer
$v_0$ is the velocity of light in a vacuum, 300 m/us.

In yet another embodiment of the present aspect, the step of obtaining the base characteristic impedance includes applying an input signal having a frequency component to a first terminal of the electrical winding; measuring an output signal at a second terminal of the electrical winding; storing the input signal data and the output signal data; and calculating the base characteristic impedance from a transmission line model of the electrical winding with the input signal data and the output signal data corresponding to one frequency. The steps of applying, measuring, storing and calculating can be repeated for a plurality of frequencies.

In a further aspect of the present embodiment, the step of obtaining the current characteristic impedance can include the steps of applying the input signal having the frequency component to the first terminal of the electrical winding; measuring a second output signal at the second terminal of the electrical winding; storing the input signal data and the second output signal data; and calculating the current characteristic impedance from the transmission line model of the electrical winding with the input signal data and the second output signal data corresponding to the one frequency. The steps of applying, measuring, storing and calculating can be repeated for the plurality of frequencies.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 8 is a circuit diagram of a faulted winding model;

FIG. 9 is Matlab script for solving Zc equations;

DETAILED DESCRIPTION

Generally, the present invention provides a method and system for obtaining the characteristic impedance of an electrical winding by measuring the input and output voltages and the currents within a winding across a lower frequency range than the FRA technique, and applying transmission line properties to model the winding. The characteristic impedance (Zc) is directly proportional to the capacitance of the winding, and is independent of external circuits. Thus any changes to Zc will reflect movements of the winding that would affect the capacitance. Because Zc has a smooth and robust monotonical relationship with frequency of the applied signal, the resulting curve is exponential in shape. A relative comparison between Zc curves will provide a clear indication of the overall axial or radial winding movements, which can be used to assess the overall health of the winding.

The following embodiments of the present invention utilizes the wave propagation property and frequency dependency of a transmission line model to obtain a characteristic impedance Zc of an electrical winding, be it a winding of a transformer, electrical motor, or electrical generator. This is due to the fact that the windings of a transformer, electrical motor, or electrical generator are sufficiently long to be treated as transmission lines.

A traditional long-wire device, such as an overhead transmission line, is considered to be "electrically long" based on its physical length, and frequency of the signal being carried by the line. A wire with a physical length l that accommodates several wavelengths l of a signal travelling at velocity a can be considered a propagation channel and can be modelled using transmission line equations.

The presently described technique for testing of transformer windings is based on the realization that a transformer winding is a long-wire device, and at high frequencies, becomes a wave propagation channel. As an example, the winding of a typical power transformer can be about 2000 meters long. Signals propagate at the speed of light in the medium, which will be typically from 200 to 300 km per second. Given a signal of 1 MHz has a period of 1 microsecond, 2000 meters of winding will have about ten wavelengths of the signal, which are sufficient to characterize the winding as a propagation channel and allow the use of wave propagation functions for its description.

Following is a discussion of the derivation of the expressions for modeling a transformer winding, which is subsequently used for calculating the characteristic impedance Zc of a winding.

Figure 1:
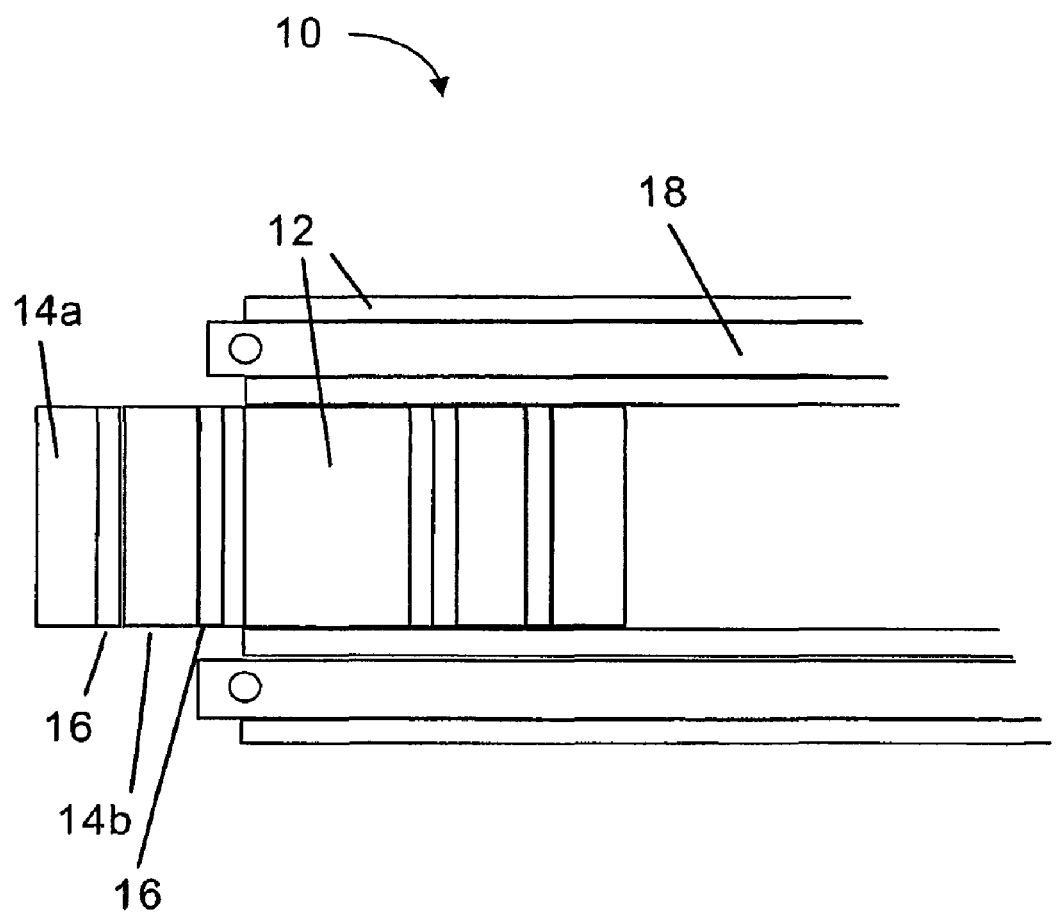
FIG. 1 is an illustration of an iron core transformer.
Figure 2:
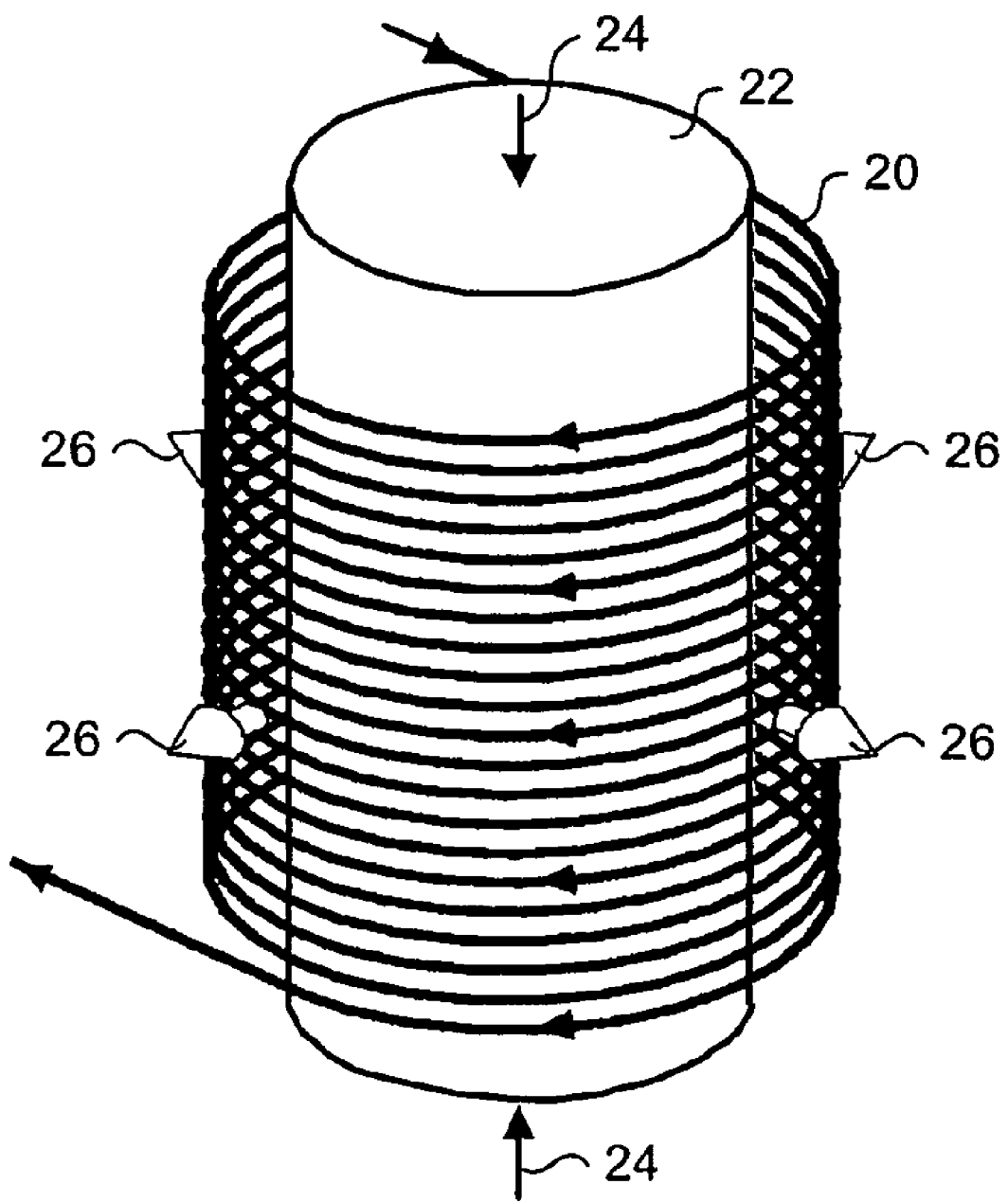
FIG. 2 is an illustration of winding movement in an iron core transformer.
Figure 3:
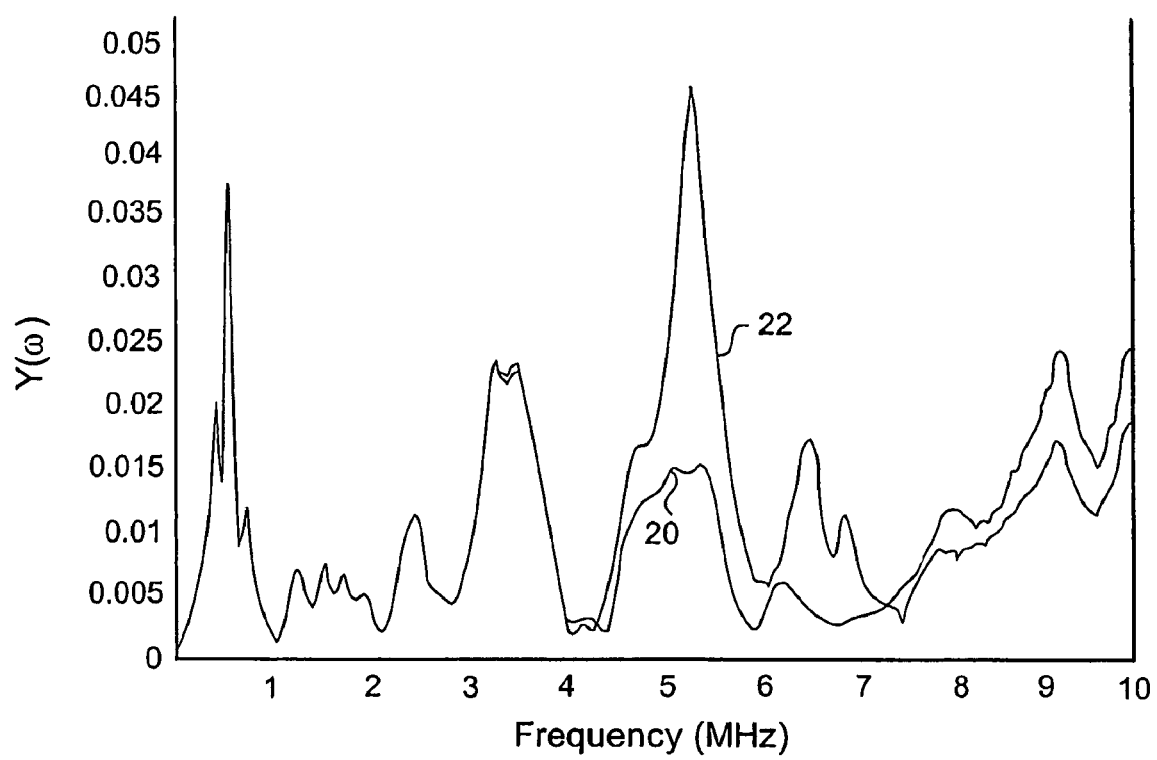
FIG. 3 is a plot of measurements of windings with and without winding movement, obtained using the FRA technique.
Figure 4:
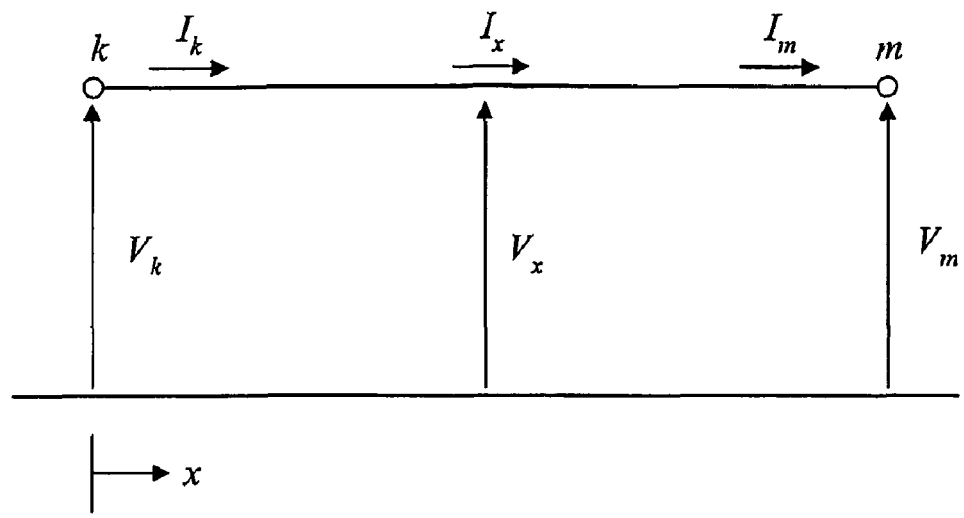
FIG. 4 is a circuit diagram of a transmission line.

FIG. 4 shows a typical transmission line, for the purpose of illustrating the following derivation of its frequency-dependent model. The following wave equations for the transmission line of FIG. 4 are as follows:

$$V_x = V_{fk} e^{-\gamma' x} + V_{bk} e^{+\gamma' k} \quad (1)$$

$$I_x = \frac{1}{Z_c} V_{fk} e^{-\gamma' x} - \frac{1}{Z_c} V_{bk} e^{+\gamma' x} \quad (2)$$

where:

$$V_f = Z_c I_f \quad (3)$$

$$V_b = -Z_c I_b \quad (4)$$

$$Z_c = \sqrt{\frac{Z'}{Y'}} \text{ is the characteristic impedance of the line} \quad (5)$$

$\gamma' = \sqrt{Z' \cdot Y'}$ is per unit length propagation constant of the line (6)

Z' is the per unit length impedance of the line, and
Y' is the per unit length admittance of the line.

By combining equations (1) and (2), a forward perturbation function can be found as given in equation (7) under the condition $V_k + Z_c I_k = 2V_{fk}$ at x=0.

where:

$$V_x + Z_c I_x = (V_k + Z_c I_k) e^{-\gamma' x} \quad (7)$$

Therefore, at node m, equation (7) becomes:

$$V_m - Z_c I'_m = (V_k + Z_c I_k) e^{-\gamma' l} \quad (8)$$

where:

$$I'_m = -I_m \quad (9)$$

l is the length of the transmission line

Figure 5:
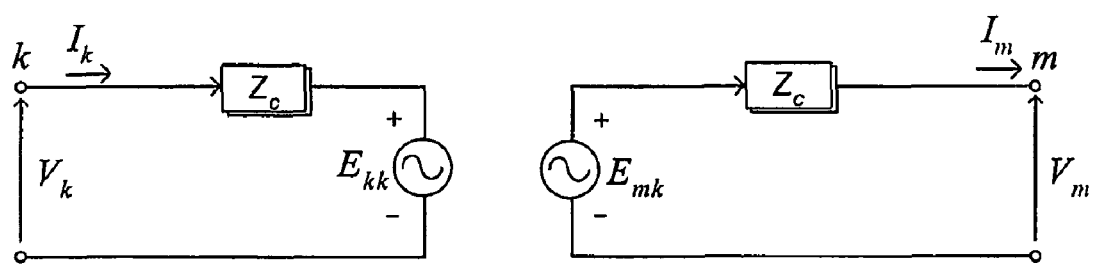
FIG. 5 is a circuit diagram of a frequency-dependent line model.

An equivalent circuit as shown in FIG. 5 follows from equations (8) and (9).

$E_{kh}$ and $E_{mh}$ are history functions and are defined as:

$$E_{mh} = (V_k + Z_c I_k) e^{-\gamma' l} \quad (10)$$

$$E_{kh} = (V_m - Z_c I_m) e^{-\gamma' l} \quad (11)$$

From FIG. 5 and the above equations, a complicated distributed frequency-dependent transmission line can be modeled as two separate lumped circuits. Each circuit includes the characteristic impedance of the transmission line, the wave propagation constant, and a history function. For a given transmission line, its characteristic impedance and propagation constant are fixed, since they are determined by the geometry and composition of the transmission line. Typical Zc of a transmission line is a smooth almost exponential curve, which decreases with frequency.

Following is a discussion of the derivation of the expressions for modeling a non-faulted transformer winding. The winding of a transformer behaves as transmission line if the frequency of the exciting voltage is sufficiently high. An individual winding is modeled by a black box which has a specific structure. The previously presented frequency-dependent model is used for the structure of the black box. The following discussion details the derivation of the parameters of the black box given that the input voltage, input current, and output voltage and output current are known or measured. The unknown parameters of the model are the characteristic impedance Zc and propagation constant of the equivalent line model.

Figure 6:
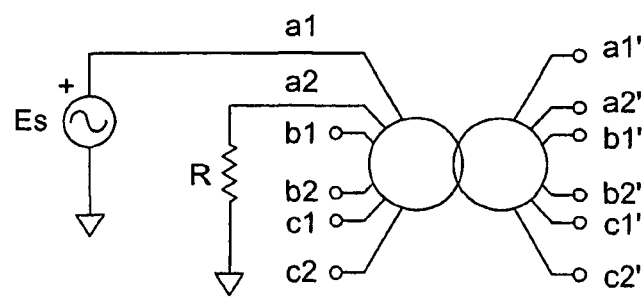
FIG. 6 is a circuit diagram showing connections of a winding under investigation.
Figure 7:
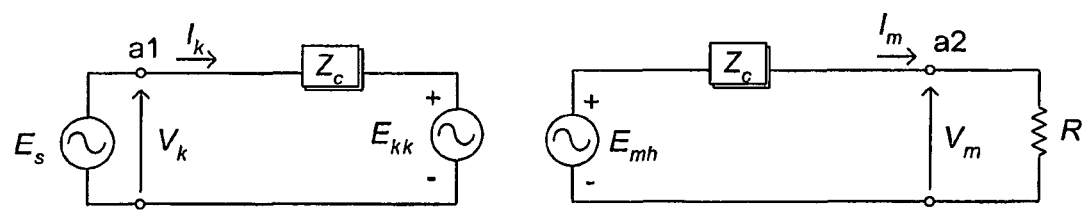
FIG. 7 is a circuit diagram of a winding model.

Reference is made to FIG. 6, which illustrates the model of the winding under investigation, as it would be physically connected. The transmission line model for the winding as connected in FIG. 6 is shown in FIG. 7. Applying Kirchoffs voltage law around the voltage loop of the right-hand side circuit of FIG. 7 gives:

$$E_{mh}=(Z_c+R)I_m \tag{12}$$

where:
$\bar{I}_m = I_m < \theta_m$ is the measured output current
Substituting the definition of $E_{mh}$ from Equation (12) yields:

$$V_k e^{-\gamma} + Z_c I_k e^{-\gamma} = Z_c I_m + R I_m \tag{13}$$

where:
$\nabla_k = E_s < 0°$ is the measured input voltage
$I_k = I_k < \theta$ is the measured input current Equation (13) contains two complex unknowns, thus another equation must be obtained. The second equation comes from applying Kirchoffs voltage law around the voltage loop of the left-hand side circuit as given by Equation (14):

$$V_k = E_{kh} + Z_c I_k \tag{14}$$

Using the definition of $E_{kh}$ from equation (13) and noting the direction of $I_m$ yields:

$$V_k - Z_c I_k = R I_m e^{-\gamma} - Z_c I_m e^{-\gamma} \tag{15}$$

Equations (13) and (15) can now be solved numerically to obtain the values for the characteristic impedance Zc and propagation constant γ. Note that the propagation constant γ obtained by this method is the actual value not the per-unit length value, i.e. γ=γ'*l. While from formula (16), τ can be obtained, which is the travelling time of wave propagation corresponding to certain ω. Formula (17) enables identification of the equivalent length of the winding, i.e $l_e$, which is in between the physical length of the winding and the height of the winding. $v_0$ is the velocity of wave propagation, which is $3e^{+8}$ m/s in air.

$$\omega*\tau = \text{imaginary\_part}(y) \tag{16}$$

$$l_e = v_0 * \tau \tag{17}$$

From the above, it can be seen that by taking measurements of currents and voltages on the two ends of the winding, Zc and γ can be obtained, which are the fingerprints of the winding without knowing the internal detailed physical parameters of the transformer. Zc and γ are further used to detect the winding displacement.

The previously shown model is now modified to account for a fault at impedance $Z_x$, an unknown location in the winding. The winding is split into two sections with effective lengths of $l_1$ and $l_2$. The modified model is shown in FIG. 8.

As with the non-faulted winding, the input voltage, input current, and output currents are known. The two sections on either side of the fault have, in general, different propagation constants; $\gamma_1$ for the leftmost section and $\gamma_2=\gamma-\gamma_1$ for the rightmost section. Kirchoffs voltage law is applied to all of the loops, as was done with the simpler non-faulted winding. Four equations result from the four loops in the model. Since there are only four unknowns, namely, $V_f$, $I_f$, $Z_x$, and $\gamma_1$, the model has a unique solution. The four equations are given by:

$$V_k - Z_c I_k = (V_f - Z_c I_f) e^{-\gamma_1 l} \tag{18}$$

$$(V_k + Z_c I_k) e^{-\gamma_1 l} = V_f + Z_c I_f \tag{19}$$

$$(I_m R - I_m Z_c) e^{-(\gamma+\gamma_1)} - \frac{V_f Z_c}{Z_x} = V_f - Z_c I_f \tag{20}$$

$$\left(V_f + Z_c I_f - \frac{Z_c V_f}{Z_x}\right) e^{-(\gamma+\gamma_1)} = I_m R + Z_c I_m \tag{21}$$

Equations (18) to (21) can be solved numerically to obtain the value of $\gamma_1$ by a Matlab script. The corresponding Matlab script for solving equations (18) to (21) is shown in FIG. 9. It is noted that equations (18) to (21) are defined as functions F1 to F4 respectively in the Matlab script.

Since the per-unit length propagation constant is assumed not to change as the result of a fault, the location of the fault is simply given by:

$$l_{e1} = l_e \cdot \frac{\gamma_1}{\gamma} \tag{24}$$

The fault impedance, $Z_x$, is also determined by the solution of equations (18) to (21) by Matlab. The determination of the fault impedance $Z_x$ can give insight into what type of fault occurred. For example, if $Z_x$ is very small, it implies that a short circuit has occurred inside the transformer.

Another significant parameter is the insulating distance between the windings, called internal insulating distance, and the insulating distance between the outer winding and the tank, called external insulating distance. The following expressions define capacitance, inductance and impedance for a transformer winding:

$$C = \frac{\varepsilon \omega h}{4\pi v_0} \frac{b+d}{bd} \cdot 10^9 \ F \tag{25}$$

$$L = 4\pi\mu \frac{\omega}{h} N^2 \frac{bd}{b+d} \cdot 10^{-9} \ H \tag{26}$$

$$Zc = 120\pi \sqrt{\frac{\mu}{\varepsilon}} \frac{N}{h} \frac{b}{1+b/d} \ \Omega \tag{27}$$

Where:
μ: magnetic permeability of the material
∈: dielectric constant of the insulation material
N: total number of the turns of the winding h: axial length of the winding b: internal insulating distance, i.e. distance between the winding and the core d: external insulating distance, i.e. distance between the winding and the tank $v_0$: velocity of light in a vacuum, 300 m/us.

As shown by equations (25) and (26), changes in the winding distances (i.e. the separation b and d) vary both the capacitance and the inductance. The increase of the separation reduces the capacitance between the winding and the ground and raises the self-inductance of the winding. Formula (27) further defines that Zc is directly proportional to $\frac{b}{1+b/d}$.

When b is much less than d, which is usually the case for transformers, the denominator of the fraction equals 1. Hence the Zc is directly proportional to b. Therefore, the internal insulation distance plays a key role in the value of Zc. When b is in the same order as d, both determine the value of Zc. In conclusion, Zc generally increases with the increase of the separation; which can be either the separation between the winding and the core, or the separation between the winding and the tank.

It should be noted that expression (27) accurately describes the Zc of large transformer windings, since the larger the diameter of the windings, the more accurate formulas (25) to (27) become.

Therefore, with the above expressions, and after the appropriate measurements are conducted, not only can the characteristic impedance signature value or curve for a particular electrical winding be determined, the approximate movement of its windings can be determined.

Figure 10:
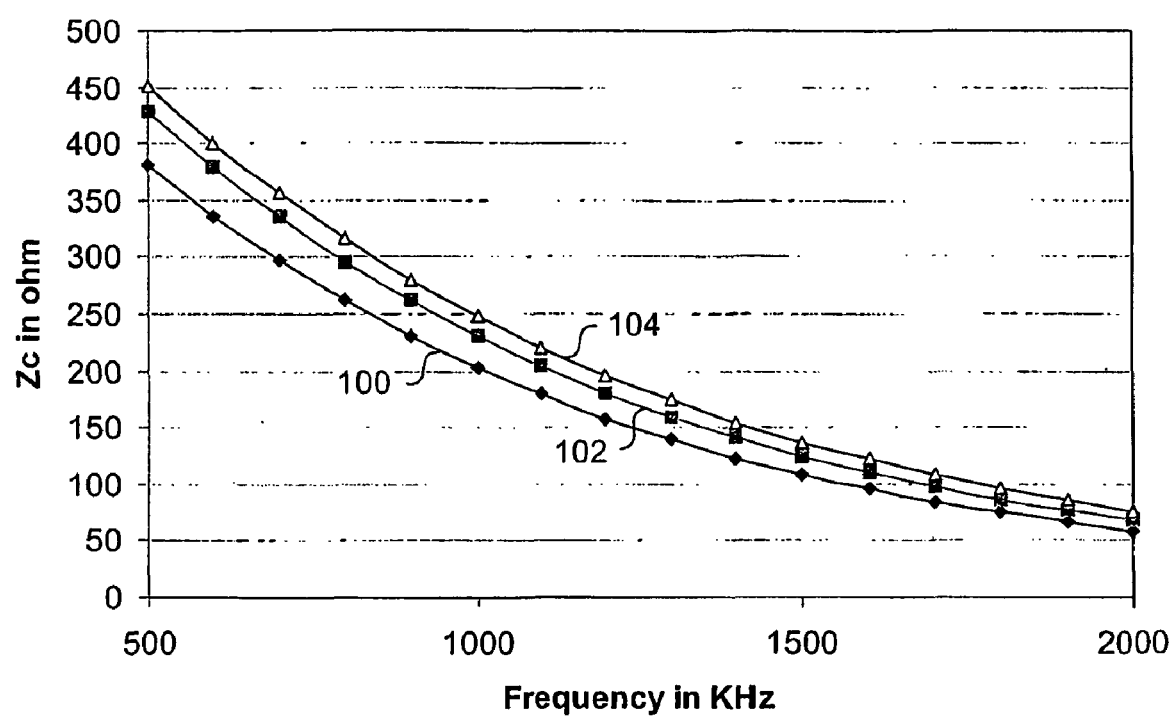
FIG. 10 is a plot of Zc for different winding movements.

FIG. 10 is a graph plotting Zc for an electrical winding with a displacement value of b=0, b=0.25 and b=0.5 inches, for a transformer winding after the application and measurement voltage and current across a frequency range of 500 KHz to 2 Mhz. Curve 100 represents the Zc curve for a displacement of b=0, curve 102 represents the Zc curve for a displacement of b=0.25 inches, and curve 104 represents the Zc curve for a displacement of b=0.5 inches. As clearly demonstrated, Zc is a smooth function of frequency, and vertical shifts of the curve are directly related to the winding displacement. Table 1 below illustrates the changes in Zc for radial winding movement in the transformer measurements obtained for the plots of FIG. 10. It is significant to note that the change in Zc between curves is more pronounced at the lower frequency of 500 kHz, than at the higher frequency of 2 MHz. This is highly advantageous since the lower frequency signals are less susceptible to noise and other electrical phenomenon that can introduce error or inaccuracies into the measurements.

TABLE 1

|  | Frequency | |
| --- | --- | --- |
|  | 500 kHz | 2 MHz |
| Zc change (for 3% radial displacement) | 50 Ω | 15 Ω |
| Zc change (for 6% radial displacement) | 75 Ω | 20 Ω |

Figure 11:
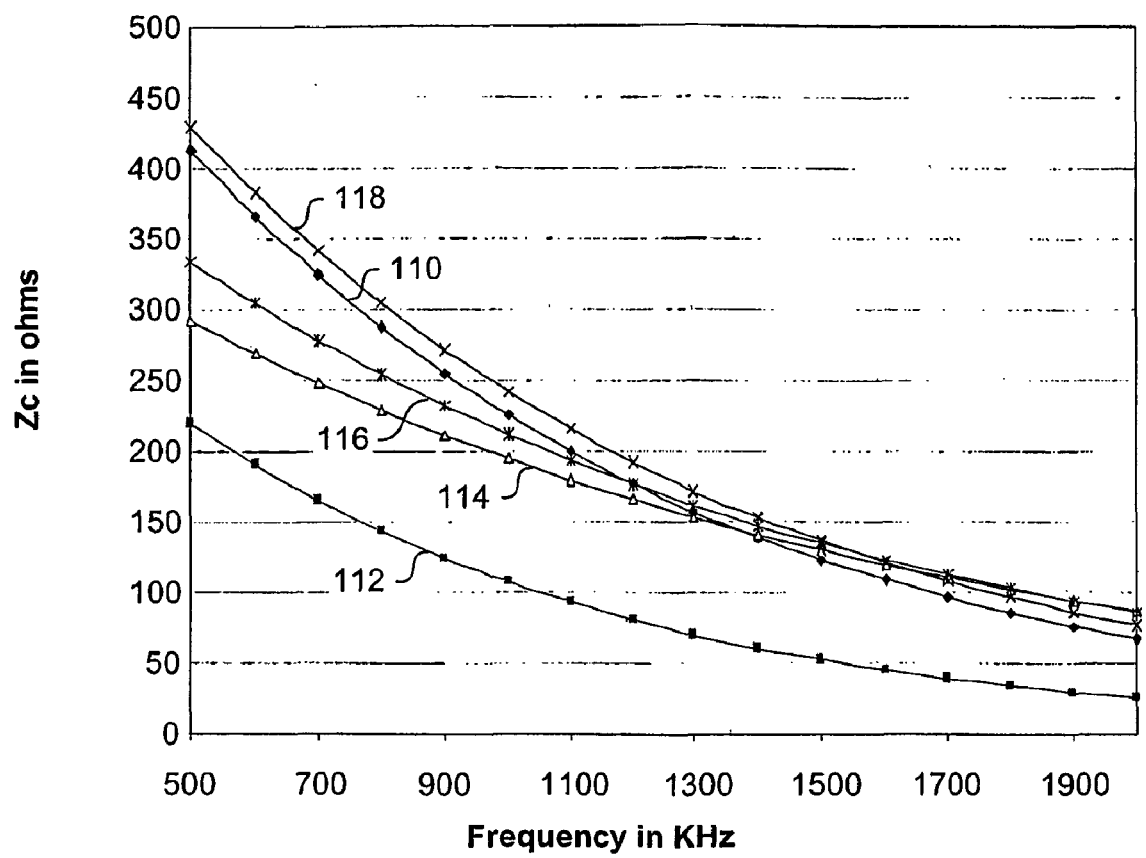
FIG. 11 is a plot of Zc for different winding faults.

Experimental results demonstrate how Zc will change in fault situations, as shown in FIG. 11. FIG. 11 plots five different Zc curves for the same electrical winding, each with different fault situations. Curve 110 is the Zc signature for a transformer winding with no fault. Curve 112 is the Zc signature when a short circuit happens in the connecting point of the two windings. Curve 114 is the Zc signature when a fault shunt branch with 220 ohms resistance occurs at the same location. Curve 116 is the Zc signature when a fault shunt branch with 330 ohms resistance occurs. Curve 118 is the Zc signature when a fault shunt branch with 4700 ohms resistance occurs, which is similar to the arcing resistance caused by partial discharge. It is assumed that the faults are located at the same location as in the short circuit case.

After applying input voltages and measuring output voltages to the winding for each case, the Zc results were calculated and plotted in FIG. 11. As evidently seen in FIG. 11, in the short circuit case 112, Zc decreased dramatically. Compared with the Zc of the original curve 110 under normal condition, Zc of the short circuit case 112 is about half of it. In the 220 and 330 ohms fault cases (curves 114 and 116 respectively), Zc curves cross the original curve 110. In the 4700 fault case (curve 118), the Zc curve is above the original curve. It is concluded that with the increase of the fault resistance, Zc begins to increase, and crosses the original non-fault curve at some certain fault impedances, and continues to go up until it is above the non-fault curve. Also, short circuit faults can be detected by observing the dramatic decrease of Zc.

Now that the expressions for modeling a transformer winding after a transmission line have been described, they can now be applied in methods and apparatus for obtaining a characteristic impedance Zc signature from a real transformer.

The characteristic impedance Zc for an electrical winding in a transformer, or electrical motor or generator, can be obtained without having to remove the device from its native environment. According to an embodiment of the present invention, a self-contained portable diagnostic device can be used to obtain Zc of a winding over time. Hence the device can be used to detect if there has been winding movement, which could lead to impending failure of the transformer, or device.

Figure 12:
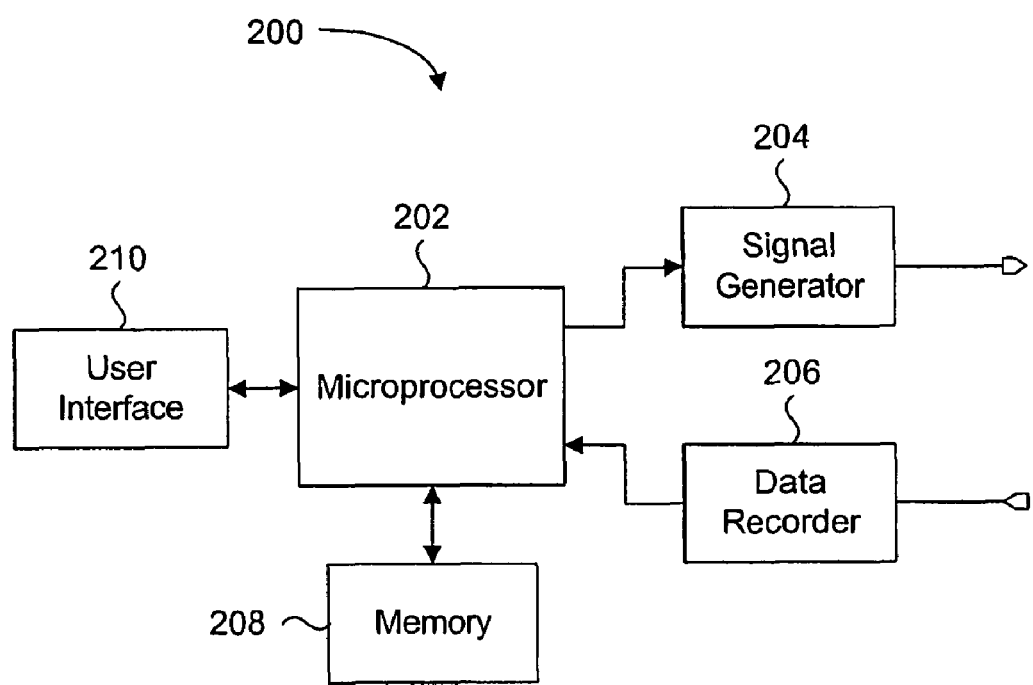
FIG. 12 is a block diagram of a winding diagnostic device according to an embodiment of the present invention.

FIG. 12 is a block diagram of a winding diagnostic device according to an embodiment of the present invention. Winding diagnostic device 200 is a portable device that is used to calculate the Zc of a particular electrical winding based upon the previously described equations. Winding diagnostic device 200 includes processing means 202, a signal generator 204, a sensing means 206, storage means 208, and a user interface 210. Processing means 202 is generally responsible for controlling all other components of the winding diagnostic device 200. Those of skill in the art will understand that such a device may include additional components, which are not shown to simplify the figure.

Processing means 202 executes algorithms and is programmed to calculate Zc based upon the previously described equations. Processing means 202 can be controlled by user interface 210 to initiate a measurement function, whereby processing means 202 provides output voltage (Vout) and current (Iout) information for a specific frequency (f). Preferably, processing means 202 steps through a range of frequencies at predetermined step sizes, so that a Zc curve can be generated for each specific frequency. For each frequency, the sensed output voltage (Vout) and current (Iout) is used to calculate Zc, and can be subsequently stored in memory 208. The sensed Vout and Iout are preferably received in digital format. Once the entire frequency range has been swept, which is preferably between 500 kHz and 2 MHz, processing means 202 can plot Zc vs frequency f, to graphically illustrate the signature of the electrical winding. As will be discussed shortly, processing means 202 can also execute Fourier transform algorithms to decompose input and output signals into frequency components for Zc and gamma calculations for a low voltage impulse test. In this test, Vin, Iin, Vout, Iout are impulse shapes that are recorded and then decomposed into frequency components by the Fourier transform algorithm.

Signal generator 204 can include a function generator, network analyzer, or a simple function generator. A network analyzer can produce discrete frequencies one at a time with high resolution. The simple function generator can inject an analog signal, such as a sinusoidal signal at a given frequency. Such signal generators can be used for what will now be called a swept frequency test. Alternatively, a recurrent surge generator (RSG) can be used to generate low voltage impulse signals for the low voltage impulse test. For example, the RSG can generate a train of square shape pulses, or pulses of other suitable shape, which are injected into the transformer winding. In either case, the function of the signal generator 204 is to provide an electrical signal having some frequency component. For Zc and gamma measurement, the output terminal of signal generator 204 is electrically connected to one terminal of the winding. For an on-line transformer, this terminal can be connected to a capacitive tap located on the tank of the transformer. Signal generator 204 produces Vout and Iout at a specific frequency f in response to the control signals from processing means 202. For off-line applications, current Iout that goes into the transformer winding and current Iin that comes out of the winding can be measured by measuring the voltage on series resistors. For on-line applications currents Iout and Iin can be measured with current pick up coils mounted on the transformer bushings or other suitable current detection devices.

Sensing means 206 can include commercially available high speed digital data recorders or customized sensing devices. Those of skill in the art will understand that such customized sensing devices would be constructed with the appropriate resolution for converting the analog signals into digital samples that represent the magnitude and phase angle of the sensed signals to be used by processing means 202. Those of skill in the art understand the functionality provided by commercially available high speed digital data recorders, such as oscilloscopes for example, and will understand that the core components of such boards can be integrated into the presently described diagnostic device 200. Sensing means 206 has a terminal connected to the other terminal of the winding, usually another capacitive tap of the transformer tank, or a ground bushing terminal, for sensing an analog Vin and Iin.

Memory 208 can be implemented as any type of known memory, and can be embedded with the microprocessor, or implemented as a discrete device. Alternately, memory 208 can include mass storage media, such as the hard drive of a computer for example. The density of memory 208 can be selected to be any suitable size. Memory 208 can be used to temporarily store Vout, Iout, Vin, In for a number of specific frequencies for subsequent processing, and/or for storing the calculated Zc for the specific frequency. Those of skill in the art will understand that memory 208 can include different types of volatile and non-volatile memory, which are addressable using well known methods.

User interface 210 can include any type of input device and feedback device, such as a screen for displaying alpha-numeric text and graphs. In the present embodiment, user interface 210 can display a Zc value for a specific frequency, a Zc curve for a range of frequencies, and information pertaining to the difference between a baseline Zc value or curve, versus a current Zc value or curve. Once the Zc differences have been calibrated to corresponding alert thresholds, fuzzy logic can be implemented to display the appropriate message for the user. For example, the displayed message can recommend to the user that the presently measured Zc for a winding indicates potential failure of the transformer, and replacement procedures should be initiated.

Figure 13:
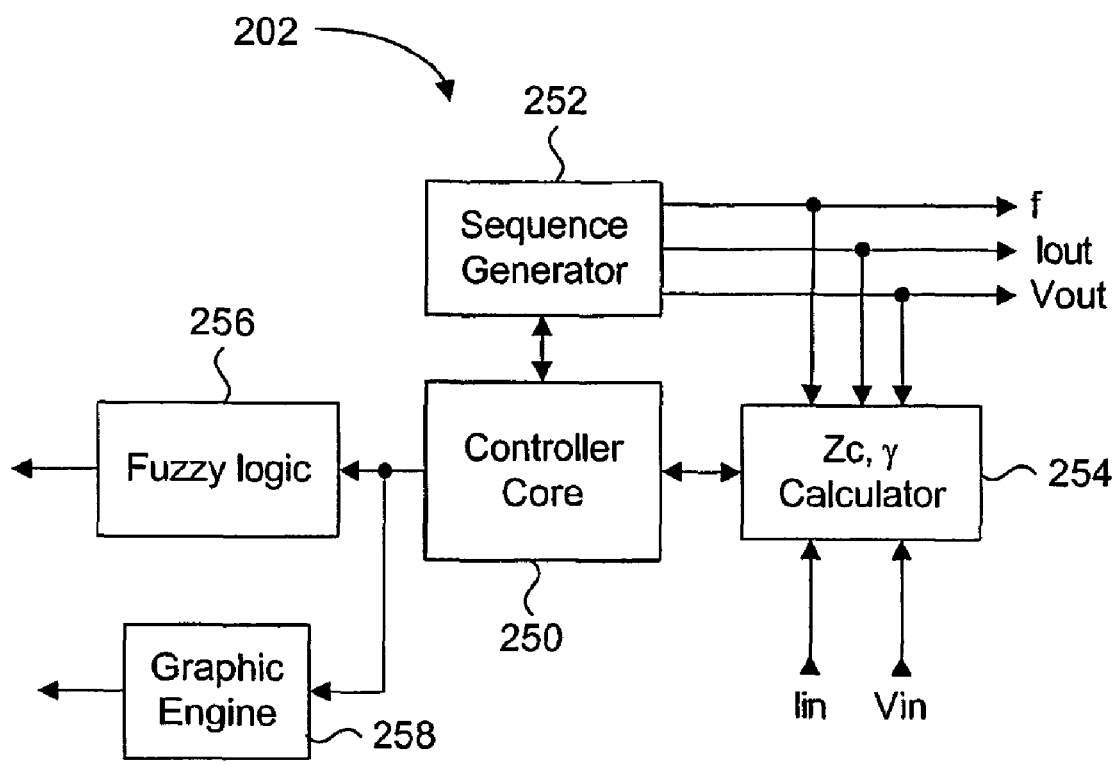
FIG. 13 is a block diagram of the functional blocks of the processing means shown in FIG. 12.

A further discussion of processing means 202 now follows. It is noted at this time that processing means 202 can be implemented with commercially available microprocessors, or other customizable processing devices such as application specific integrated circuits (ASIC). FIG. 13 illustrates the preferred functional blocks that are included within processing means 202.

Processing means 202 includes a basic controller core 250, a sequence generator 252, a characteristic impedance calculation engine 254, fuzzy logic engine 256, and a graphic engine 258.

Controller core 250 is responsible for controlling its peripheral components, and their interaction with each other. Controller core 250 can execute various comparison routines for comparing different Zc values or curves to each other and provide a difference value, which can then be interpreted by fuzzy logic engine 256.

Sequence generator 252 can be pre-programmed with specific Vout, Iout values, and frequencies f, which are provided to signal generator 204 in accordance with one or more preset sequences. For the low voltage impulse test method, sequence generator 252 can provide parameters relating to the pulse train to be generated by signal generator 204.

Calculation engine 254 receives the digital values of Vout, Iout and f, and the digitized values of Vin and Iin, and is pre-programmed with the transmission line models for a winding, as shown by the previously discussed equations and algorithm for executing the Matlab script shown in FIG. 9. The resulting Zc value for a specific input frequency can be fed to controller core 250 which can then store the value in memory 208 for later batch processing with Zc values for other specific frequencies. Calculation engine 254 can execute further mathematical computations, for example, the approximate winding displacement can be calculated for a current Zc measurement, relative to a previous Zc measurement. For the low voltage impulse test method, calculation engine 254 can include the Fourier transform algorithms for decomposing applied and received input pulses, where each component frequency is then treated as a separate frequency so that Zc and gamma functions can be calculated for each one of these frequencies.

Fuzzy logic block 256 can receive the calculated difference between different Zc values/curves and apply pre-programmed fuzzy logic to provide corresponding text messages. Alternatively, fuzzy logic block 256 can execute the comparison routines instead of controller core 250.

Operating in parallel can be graphic engine 258, which simply plots the calculated Zc values against frequency, and presents an exponential Zc signature curve, similar in shape to those shown in FIG. 10. Graphic engine 258 can superimpose more than one Zc curve to better illustrate shifts between the curves.

Since the aforementioned winding diagnostic device 200 is portable, any technician can quickly and easily obtain a Zc signature of one or more windings of a transformer, or any device employing long windings, such as electrical motors or generators.

The cost and complexity of winding diagnostic device 200 can be reduced by removing the processing means 202, and consequently, any Zc calculating capability. Hence, device 200 would be reduced to a signal generating and electrical parameter measuring/collecting device. In such an embodiment, the measured values can be stored in memory 208, and downloaded to a laptop computer, or alternatively, sent out through communication means to a centralized transformer monitoring facility or asset management centre. The laptop computer, or the computers at the centralized processing centre, can execute all the necessary calculations to generate Zc once the input and output values have been provided. In this alternate embodiment, the laptop computer, or the computers in the centralized processing centre, replace components 202 and 210 of FIG. 12.

The previously discussed embodiments employ a signal generator to apply the desired input signals to the winding for subsequent output measurements. However, if high frequency signals are generated within the power system itself during, for example, switching operations, short circuit faults, or lightning discharges, the external signal generator 204 is not required. The sensing means can be the same as previously described, or alternatively, can be existing sensors in the system.

Now a method of calculating Zc according to an embodiment of the present invention is described with reference to FIG. 14. The general method for obtaining the characteristic impedance involves applying an input voltage and current to one terminal of the electrical winding at a given frequency, and measuring the output voltage and current signal at the other terminal of the electrical winding. While a single Zc value is sufficient for establishing a signature for a particular winding, it is preferable to utilize multiple values to compensate for potential measurement errors. In other words, the use of multiple Zc values, from different input voltage/current frequencies, ensures robustness of the overall winding signature.

Figure 14:
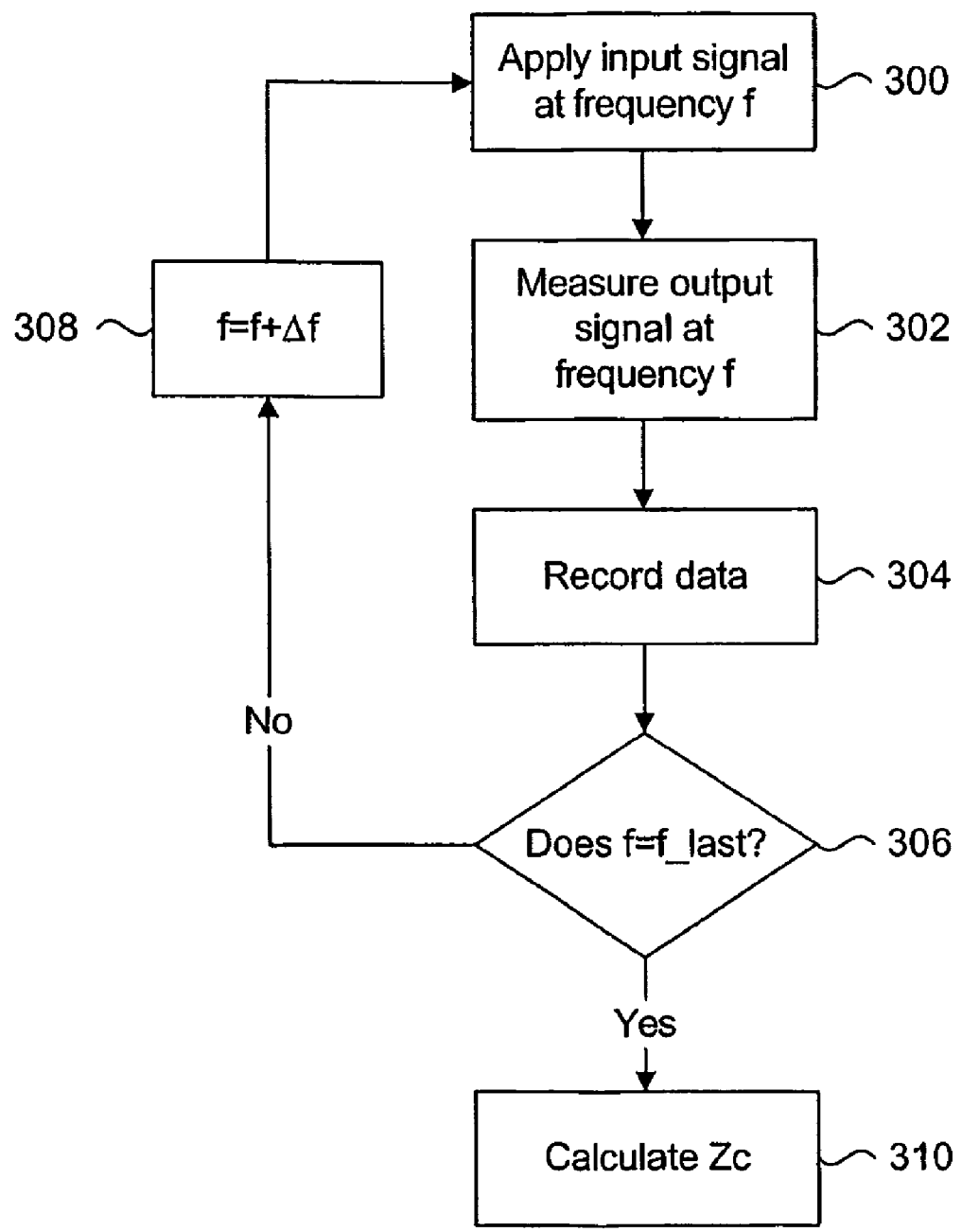
FIG. 14 is a flow chart showing a method of calculating Zc for a winding.

The method of FIG. 14 assumes that a winding diagnostic device, such as the previously described device 200, has its terminals properly connected to the ends of a winding. The method begins at step 300, where an input signal having a particular Vout and Iout value is applied to one end of the winding, at an initial frequency f. At step 302, the Vout and Iout values are measured and stored in memory at step 304. A decision is made at step 306 to determine if the present frequency is the last frequency of the input signal to be applied. If no, then the process proceeds to step 308 where the input frequency is increased by a predetermined increment of f, and the process repeats at step 300 with the incremented frequency. If the present frequency is the last input frequency, then the characteristic impedance Zc at each of the input frequencies is calculated at step 310. As previously discussed, Zc can be calculated with the previously described equations. Now the characteristic impedance signature of the winding has been obtained, and can be graphically plotted to visually verify its exponential shape. The above mentioned method can be modified to calculate Zc in each frequency loop, and then store each calculated Zc in memory.

The method of FIG. 14 can be modified as follows for implementing the low voltage impulse test. At step 300, a train of pulses are applied to the winding. At step 302 the output shapes are measured, and then stored at step 304. The method then skips step 306, and proceeds to step 310 where the stored impulse shapes are decomposed into frequency components, such that the characteristic impedance Zc and gamma functions can be calculated for each of the frequencies. Accordingly, steps 306 and 308 are not required since the frequency components are obtained through Fourier transform analysis.

Figure 15:
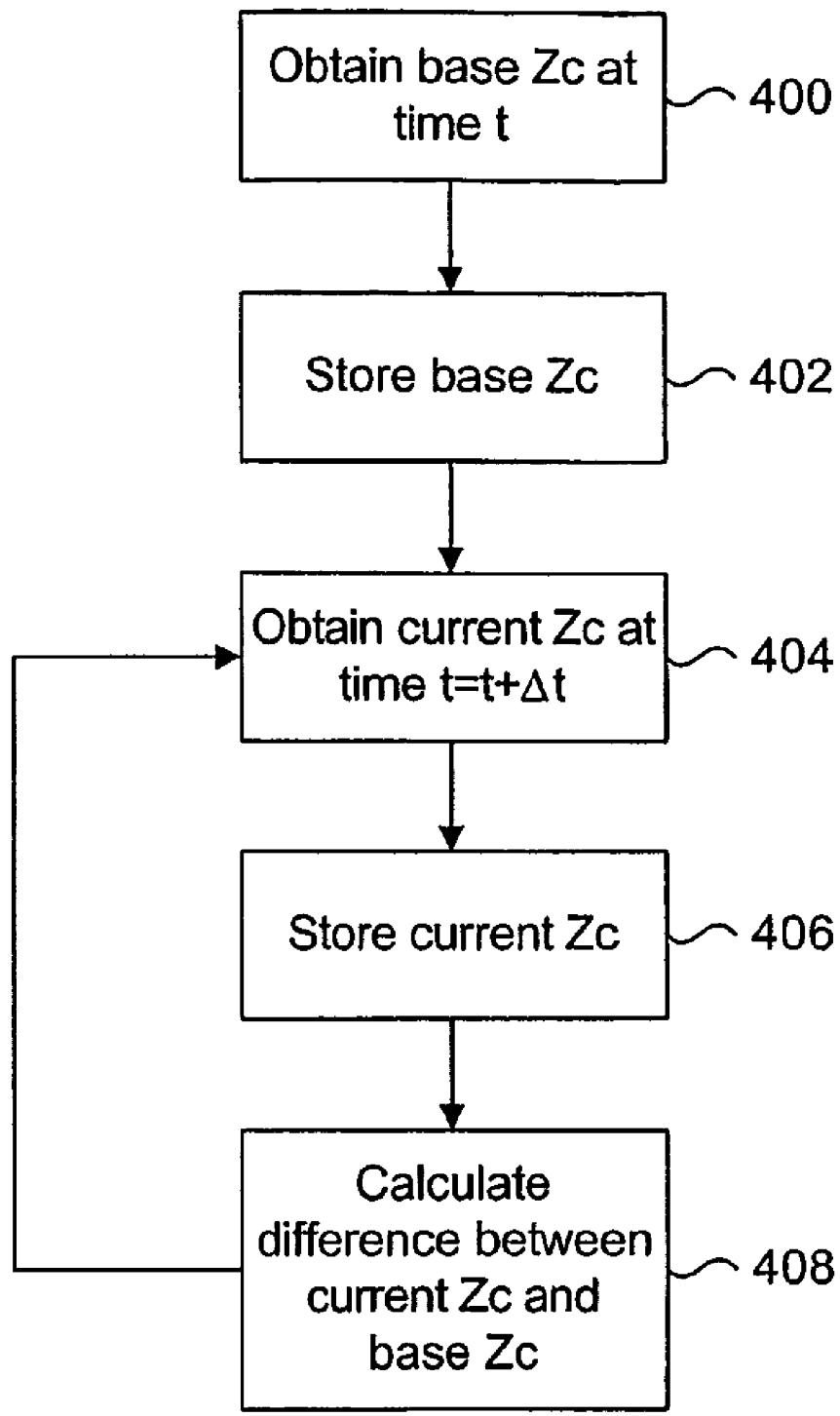
FIG. 15 is a flow chart showing a method of diagnosing the health of a winding.

Now that the method for obtaining a signature is described, the signatures can be used to diagnose the health of the winding. FIG. 15 is a flow chart illustrating an example of one such method, according to an embodiment of the present invention.

The method of diagnosing a winding shown in FIG. 15 starts at step 400, where a base characteristic impedance Zc signature is obtained at time t=0. Preferably, this base Zc represents the Zc signature for the winding of a new transformer, which is known to not have any faults or winding displacement. The base Zc can be obtained through measurement and calculation as shown in FIG. 14. However, if the transformer has been in operation for a long period of time, a current measurement of its Zc will not be representative of its "new" condition. In such a circumstance, it is possible to obtain the base Zc by knowing the physical parameters of the transformer winding, and applying equation (27) above. Once obtained, the base Zc is stored in memory for that particular transformer winding at step 402. At a subsequent period in time, another measurement of Zc is made at step 404. This measurement can be done at regular intervals, such as once every year, or shortly after a thunderstorm. This current Zc is stored in memory for the same transformer winding at step 406. Having the current Zc and the base Zc, a difference between the two can be easily calculated at step 408. The magnitude of the difference can indicate the level of winding movement, where a relatively large difference can indicate potential for transformer failure, while a negligible difference indicates very little to no winding movement. Of course, a complete history of Zc for a particular winding can be plotted to show progressive winding movement over time. An extrapolation of the Zc history may indicate the failure potential of the transformer in the future. Accordingly, the transformer can be replaced before catastrophic and dangerous failure occurs.

An alternate technique for diagnosing the relative health of a winding can be conducted as follows. Standard three phase transformers have three identical windings. Since it is unlikely that all three windings will suffer identical movement, the Zc for each winding can be measured and calculated, and then compared to each other. If the Zc of all three windings are substantially similar, then there has not been any significant movement in any of the windings. However, if one Zc is different than the other two, then the technician can quickly identify the winding that has suffered some type of winding movement.

While the previously described embodiments of the present invention illustrate a low input signal frequency of 500 kHz, even lower input signal frequencies can be used to calculate the characteristic impedance of the electrical winding. The minimum frequency input signal that can be used for any given electrical winding will be dependent on the maximum length of the winding, which can easily be determined by any person of skill in the art. As previously mentioned, if a sufficient number of wavelengths of the signal can propagate through winding, then the wave propagation functions can be used to describe it. Naturally, the data recorders should preferably be highly accurate and relatively immune to electrical noise and other phenomenon that can adversely affect the output signal measurements.

While the previously described embodiments of the present invention describe methods and apparatus for obtaining characteristic impedances of electrical windings of transformers that are on-line, meaning that they are connected to the main electrical system, they can also be applied to off-line transformers. A disconnected transformer being tested according to the embodiments of the invention will yield characteristic impedance values which are at least as accurate as those determined while the transformer is on line.

By taking advantage of the wave propagation property and frequency-dependent transmission line model, one can simulate the real transformer winding as a high frequency distributed transmission line, obtain the characteristic impedance and propagation constant of the winding, calculate the travelling time for certain frequency for the total equivalent length of the winding. By comparing the historical change of the characteristic impedance Zc the presence of winding distortion or movement can be detected. The fault location results in an equivalent sub length, which can be compared with the total equivalent length and further used to determine where the winding movement or distortion has occurred.

The above-described embodiments of the present invention are intended to be examples only. Alterations, modifications and variations may be effected to the particular embodiments by those of skill in the art without departing from the scope of the invention, which is defined solely by the claims appended hereto.

The invention claimed is:

1. A diagnostic device for generating a characteristic impedance for an electrical winding having an input terminal and an output terminal, comprising:
    a signal generator for applying an electrical signal having a frequency component to the input terminal of the electrical winding;
    sensing means for detecting a magnitude and a phase of an output electrical signal at the output terminal of the electrical winding, the sensing means converting the magnitude and the phase of the output electrical signal into digital signals;
    a processing means for setting parameters of the electrical signal and for receiving the digital signals, the processing means calculating the characteristic impedance with the digital signals and the parameters of the electrical signals corresponding to one frequency, based on a transmission line model of the electrical winding; and
    storage means for storing the digital signals and the parameters of the electrical signal.

2. The diagnostic device of claim 1, wherein the signal generator includes one of a function generator and a network analyzer for generating the electrical signal at the one frequency.

3. The diagnostic device of claim 1, wherein the one frequency is a minimum frequency, the minimum frequency being selected corresponding to a maximum length of the electrical winding.

4. The diagnostic device of claim 1, wherein the one frequency is at least 500 kHz.

5. The diagnostic device of claim 1, wherein the sensing means includes a high speed digital data recorder.

6. The diagnostic device of claim 1, wherein the storage means includes a memory device.

7. The diagnostic device of claim 1, wherein the processing means includes
    a sequence generator for setting the parameters of the electrical signal for generation by the signal generator, the parameters including input voltage, input current and the one frequency, and
    a calculation engine for receiving the input voltage, the input current, the one frequency, and the digital signals, the calculation engine being programmed with the transmission line model of the electrical winding for calculating the characteristic impedance.

8. The diagnostic device of claim 7, wherein the processing means further includes a controller core for receiving the characteristic impedance from the calculation engine, the controller core comparing the characteristic impedance with a base characteristic impedance to provide a corresponding difference value,
    a fuzzy logic engine for receiving the corresponding difference value and for applying pre-programmed fuzzy logic to provide a corresponding text message, and
    a graphic engine for receiving the characteristic impedance and the base characteristic impedance for generating graphical plot information.

9. The diagnostic device of claim 8, wherein the controller calculates an approximate displacement value of the electrical winding corresponding to the difference value.

10. The diagnostic device of claim 8, further including a user interface for displaying the corresponding text message and for displaying the graphical plot information as a graph of impedance versus frequency.

11. The diagnostic device of claim 1, wherein the transmission line model of the electrical winding is expressed by $$V_k e^{-\gamma} + Z_c I_k e^{-\gamma} = Z_c I_m + R I_m;$$

$$V_k - Z_c I_k = R I_m e^{-\gamma} - Z_c I_m e^{-\gamma};$$

for representing the circuit model of the electrical winding shown in FIG. 7, where $\gamma$ is the propagation constant.

12. The diagnostic device of claim 11, wherein the transmission line model of the electrical winding is further expressed by $$V_k - Z_c I_k = (V_f - Z_c I_f) e^{-\gamma 1};$$

$$(V_k + Z_c I - k) e^{-\gamma 1} = V_f + Z_c I_f;$$

$$(I_m R - I_m Z_c) e^{-(\gamma + \gamma_1)} - \frac{V_f Z_c}{Z_x} = V_f - Z_c I_f;$$

$$\left(V_f + Z_c I_f - \frac{Z_c V_f}{Z_x}\right) e^{-(\gamma + \gamma_1)} = I_m R + Z_c I_m;$$

where each expression represents a loop in the circuit model of the electrical winding shown in FIG. 8, where: $\gamma$ is the propagation constant, and $\gamma_1$ is the propagation constant of the leftmost loop in the circuit model shown in FIG. 8.

13. The diagnostic device of claim 1, wherein the signal generator includes a recurrent surge generator for generating the electrical signal, the electrical signal including a train of pulses.

14. The diagnostic device of claim 13, wherein the train of pulses includes a train of square pulses.

15. The diagnostic device of claim 13, wherein the processing means includes a calculation engine for executing a Fourier transform algorithm to decompose the electrical signal and the digital signals into frequency components.

16. The diagnostic device of claim 1, wherein the electrical winding includes a transformer winding housed in a tank.

17. The diagnostic device of claim 16, wherein the transformer is on-line.

18. A method for determining a characteristic impedance of an electrical winding, comprising:
    applying an input signal having a frequency component to a first terminal of the electrical winding;
    measuring an output signal at a second terminal of the electrical winding;
    storing the input signal data and the output signal data; and calculating the characteristic impedance based on a transmission line model of the electrical winding with the input signal data and the output signal data corresponding to one frequency.

19. The method of claim 18, wherein the step of applying includes generating an analog signal having predetermined voltage and current values at the one frequency.

20. The method of claim 19, wherein applying an input signal having a frequency component to a first terminal of the electrical winding, measuring an output signal at a second terminal of the electrical winding, and; storing the input signal data and the output signal data are repeated for a plurality of distinct frequencies before the step of calculating.

21. The method of claim 20, wherein step of calculating includes calculating the characteristic impedance of the electrical winding at each of the plurality of distinct frequencies.

22. The method of claim 18, wherein the one frequency is a minimum frequency, the minimum frequency being selected corresponding to a maximum length of the electrical winding.

23. The method of claim 18, wherein the one frequency is at least 500 kHz.

24. The method of claim 18, wherein the step of applying includes generating a pulse train having predetermined voltage and current values.

25. The method of claim 24, wherein the step of calculating includes executing a Fourier transform algorithm for decomposing the input signal and the output signal into frequency components, where the frequency components include the one frequency.

26. The method of claim 25, wherein the one frequency is at least 500 kHz.

27. The method of claim 18, wherein the electrical winding includes a transformer winding housed in a tank.

28. The method of claim 27, wherein the transformer is on-line.

29. A method for assessing a condition of an electrical winding, comprising:
 obtaining a base characteristic impedance of the electrical winding at a first time;
 storing the base characteristic impedance corresponding to the first time;
 obtaining a current characteristic impedance of the electrical winding at a second time after the first time;
 storing the current characteristic impedance corresponding to the second time;
 calculating a difference value between the current characteristic impedance and the base characteristic impedance; and
 calculating an approximate winding displacement from the difference value.

30. The method of claim 29, further including a step of calculating an approximate fault impedance of the electrical winding at the second time.

31. The method of claim 29, wherein the step of obtaining the base characteristic impedance includes calculating the base characteristic impedance from:

$$Zc = 120\pi \sqrt{\frac{\mu}{\varepsilon}} \frac{N}{h} \frac{b}{1+b/d}$$

where:
 Zc is the base characteristic impedance,
 $\mu$ is a magnetic permeability of the electrical winding material
 $\in$ is a dielectric constant of insulation material
 N is a total number of the turns of the electrical winding
 h is an axial length of the electrical winding
 b is an insulating distance between the electrical winding and a core of a transformer
 d is an insulating distance between the electrical winding and a tank of the transformer.

32. The method of claim 29, wherein the step of obtaining the base characteristic impedance includes
 applying an input signal having a frequency component to a first terminal of the electrical winding;
 measuring an output signal at a second terminal of the electrical winding;
 storing the input signal data and the output signal data; and
 calculating the base characteristic impedance from a transmission line model of the electrical winding with the input signal data and the output signal data corresponding to one frequency.

33. The method of claim 32, wherein applying an input signal having a frequency component to a first terminal of the electrical winding, measuring an output signal at a second terminal of the electrical winding, storing the input signal data and the output signal data, and calculating the base characteristic impedance from a transmission line model of the electrical winding with the input signal data and the output signal data corresponding to one frequency are repeated for a plurality of frequencies.

34. The method of claim 32, wherein the step of obtaining the current characteristic impedance includes
 applying the input signal having the frequency component to the first terminal of the electrical winding;
 measuring a second output signal at the second terminal of the electrical winding;
 storing the input signal data and the second output signal data; and,
 calculating the current characteristic impedance from the transmission line model of the electrical winding with the input signal data and the second output signal data corresponding to the one frequency.

35. The method of claim 34, wherein applying the input signal having the frequency component to the first terminal of the electrical winding, measuring a second output signal at the second terminal of the electrical winding, storing the input signal data and the second output signal data, and calculating the current characteristic impedance from the transmission line model of the electrical winding with the input signal data and the second output signal data corresponding to the one frequency are repeated for the plurality of frequencies.

* * * * *